United States Patent [19]
Ishikura et al.

[11] Patent Number: 6,162,366
[45] Date of Patent: Dec. 19, 2000

[54] ETCHING PROCESS

[75] Inventors: Junri Ishikura, Kawasaki; Toshiaki Yoshikawa, Yokohama, both of Japan

[73] Assignee: Canon Kabushiki Kaisha, Tokyo, Japan

[21] Appl. No.: 09/218,421

[22] Filed: Dec. 22, 1998

[30] Foreign Application Priority Data

Dec. 25, 1997 [JP] Japan ..................................... 9-358257
Dec. 25, 1997 [JP] Japan ..................................... 9-358338
Jul. 29, 1998 [JP] Japan ..................................... 10-214514

[51] Int. Cl.[7] ........................................................ H05K 3/06
[52] U.S. Cl. ............................ 216/13; 216/105; 252/79.1
[58] Field of Search ................................. 216/13, 22, 95, 216/96, 100, 105

[56] References Cited

U.S. PATENT DOCUMENTS 3,770,530  11/1973  Fujimoto ..................................... 156/3
4,784,785  11/1988  Cordani et al. ........................ 252/79.4
5,244,539  9/1993  McGrath et al. ........................ 156/656
5,683,943  11/1997  Yamada ..................................... 437/220

FOREIGN PATENT DOCUMENTS 47-43971   12/1972  Japan .
5-267299   10/1993  Japan .
6-57454     3/1994  Japan .
6-232128    8/1994  Japan .
8-311663   11/1996  Japan .

*Primary Examiner*—Randy Gulakowski
*Assistant Examiner*—Allan Olsen
*Attorney, Agent, or Firm*—Fitzpatrick, Cella, Harper & Scinto

[57] ABSTRACT

An etching process includes the steps of: preparing an etchant containing ferric chloride and an anticorrosive agent for Cu, and etching with said etchant a multi-layer metal structure including a Cu layer and an Ni layer. The etchant may preferably further contain ferrous chloride. The etching process is effective in making etching rates of the respective substantially equal, thus suppressing occurrence of burr portions of the Ni layers.

15 Claims, 5 Drawing Sheets

ETCHING PROCESS

FIELD OF THE INVENTION AND RELATED ART

The present invention relates to an etching process for etching a multi-layer metal structure comprising at least a layer of copper (Cu).

There have been proposed various etching processes for etching a multi-layer metal structure including, e.g., a layer of Cu or Cu alloy and a layer of nickel (Ni) or Ni alloy.

Such a multi-layer metal structure including a Cu layer and an Ni layer may generally be used as a metal electrode for use in a liquid crystal panel. Specifically, the liquid crystal panel includes a pair of glass substrates for sandwiching a liquid crystal therebetween and a plurality of metal electrodes formed on the surface of the glass substrate (s). Each of the metal electrodes may be formed in a plurality of layers including a Cu layer and an Ni layer.

The Cu layer constituting the metal electrodes is effective in increasing a liquid crystal drive speed due to a small electrical resistance of Cu, thus allowing a large picture area and a high resolution to a resultant liquid crystal panel.

On the other hand, the Ni layer is effective not only in improving an adhesiveness (adhesive properties) between the Cu layer and the (glass) substrate by disposing it therebetween (e.g., Japanese Laid-Open Patent Application No. (JP-A) 47-43971) but also in preventing oxidation of the Cu layer by disposing it so as to cover the Cu layer (e.g., JP-A 6-232128).

The above-mentioned metal electrodes may generally be formed by film-formation of the multi-layer metal structure (including the Cu layer and the Ni layer) over the entire surface of the glass substrate and wet-etching of the multi-layer metal structure.

In the wet-etching step, however, the Ni layer shows an etching rate smaller (slower) than that of the Cu layer. As a result, as shown in FIG. 1, Ni layers 21 and 23 sandwiching a Cu layer 22 are left as a burr portion, thus being liable to cause short-circuit. Further, if the Cu layer 22 is etched excessively, the resultant metal electrodes are liable to lose their function as (auxiliary) electrodes for the liquid crystal panel in some cases. In FIG. 1, a reference numeral 1 represents a glass substrate.

In order to solve such problems, there has been proposed an etchant comprising an acidic solution of nitric acid and hydrogen peroxide aqueous solution as a principal component and additives including a carboxyl group-containing organic acid and a heterocyclic compound containing a ring-constituting nitrogen atom as a group of —NH— or =N— (JP-A 6-57454).

However, such an etchant is liable to dissolve the Cu layer, thus causing a partial peeling of an etching (resist) mask covering the Cu layer thereby to hinder accurate pattern formation.

There has been also proposed an etchant, for dissolving the Ni layer without dissolving the Cu layer, comprising an inorganic acid, peroxide and a surfactant (JP-A 8-311663).

Incidentally, an etchant generally shows a temperature dependence of an etching rate such that a degree of the temperature dependence is small in the vicinity of room temperature but is large at 40° C. or higher. More specifically, the etching rate is little changed even when an etching temperature is somewhat changed in the vicinity of room temperature but is changed considerably only by a little change at at least 40° C.

In the case of the etchant described in JP-A 8-311663, the etching temperature of the etchant is increased due to inclusion of peroxide, thus resulting in a difficulty of temperature control.

Accordingly, it becomes difficult to control the above-mentioned temperature-dependent etching rate, thus failing to make etching qualities constant in a mass-production process.

Further, peroxide contained in the etchant (JP-A 8-311663) is added to supplement the etchant with active oxygen. Such active oxygen is consumed during the etching, so that it is necessary to always keep an amount of active oxygen constant by adding fresh peroxide. The addition of (fresh) peroxide, however, changes the composition or concentration of the etchant, thus leading to a change in etching rate. As a result, etching qualities in a mass-production process are liable to be rendered nonuniform.

As a material for the metal electrodes of the liquid crystal panel, the above-mentioned Cu layer (i.e., a layer of Cu or Cu alloy) may preferably be used as described above since Cu or Cu alloy has an electrical resistance lower than Al or Al alloy to improve the liquid crystal panel with a high resolution.

The metal electrode made of Cu, however, has a poor adhesiveness to the glass substrate and is readily oxidized as described above.

In order to remedy such drawbacks of the Cu metal electrode, there have been proposed a metal electrode having a lamination structure including a Cu layer and an adhesive layer disposed between the Cu layer and an insulating substrate (JP-A 47-43971) or a metal electrode having a lamination structure including a Cu layer and an anti-oxidant (protective) layer disposed so as to cover the Cu layer (JP-A 6-232128).

As the adhesive layer and the anti-oxidant layer, a layer of Ni-Mo alloy may, e.g., be used. This is because a layer of Ni is preferred for the purposes of improvement in adhesiveness and prevention of oxidation but is accompanied with the following problem.

In the case where these layers are formed only of Ni by magnetron sputtering, it is necessary to use a Ni target as a sputtering target in order to cause discharge. Ni is essentially a magnetic material and thus the Ni target is required to be formed in a thinner layer (ca. 1 mm). However, the thinner Ni target is required to be frequently replaced in the case of mass production, thus lowering production efficiency.

On the other hand, in the case where the adhesive and anti-oxidant layers are formed of Ni-Mo alloy which is non-magnetic material readily causing discharge. As a result, it is possible to make a thickness of a sputtering target thicker (ca. 7 mm), thus solving the above-mentioned problem.

As mentioned above, the metal electrode having the multi-layer metal structure may be formed through the wet etching with an etchant.

As one of the etchant, there has been proposed one comprising acidic solution containing benzotriazole as an etching inhibitor for Cu.

In the case of a multi-layer metal structure including an adhesive layer and/or anti-oxidant layer comprising Mo, however, etching of such Mo-containing layer(s) is little effected although the Cu layer is appropriately etched, thus leaving burr portions of the Mo-containing layer(s).

In this regard, FIG. 3A shows a state after the etching of such a multi-layer metal structure with an etching resist formed on a glass substrate and FIG. 3B shows a state of the multi-layer metal structure (of FIG. 3A) after removal of the etching resist.

Referring to the figures, a multi-layer metal structure 2 including an adhesive layer 121 of, e.g., Ni-Mo alloy, a layer 22 of Cu or Cu alloy, and an anti-oxidant layer 123 of, e.g., Ni-Mo alloy is formed on a glass substrate 1 and is covered with an etching resist 4.

As shown in FIGS. 3A and 3B, the Ni-Mo layers 121 and 123 are liable to form burr portions (insufficiently etched portions) causing (electrical) short circuit.

In this case, when an etching time is prolonged in order to dissolve the burr portions of the Ni-Mo layers 121 and 123, the Cu layer 122 is etched excessively or over-etched.

In the case where the multi-layer metal structure as described above is used as metal electrodes of a liquid crystal panel, spacings between the metal electrodes are filled with a resin to form a flat surface, on which a transparent electrode of, e.g., ITO (indium-tin-oxide) is generally formed. In this instance, however, when the anti-oxidant layer forms burr portions as described above, an adhesiveness between the resin and the multi-layer metal structure (metal electrode) is liable to be impaired.

Incidentally, the anti-oxidant (protective) layer for preventing corrosion of the Cu layer disposed thereunder has generally been formed of metal or alloy with Cu (e.g., Ni, Cr, Mo or Cu-Ni) as described in, e.g., JP-A 5-267299 and JP-A 6-232128.

The anti-oxidant layer of the above metals or alloys thereof which have higher anticorrosive properties than Cu is generally formed in a prescribed pattern by dry etching. The dry etching is, however, required to employ an expensive large apparatus and is also effected at a high substrate temperature, so that when a glass substrate is used, the glass substrate per se is liable to be deformed. Even if the substrate is changed to a silica glass substrate having no heat-absorbing properties, the etching rate of the Cu layer is too low for practical use.

On the other hand, in the wet etching, almost all the known etchants (etching liquids) generally show considerably different etching rates between the Cu layer and other metal layers (adhesive layer and anti-oxidant layer) of, e.g., Ni or Mo. Accordingly, it is difficult to form practical metal electrodes (mult-layer metal structure) by the wet etching with such etchants. More specifically, when acids or alkalis are used as an etchant for the wet etching, the Cu layer is etched excessively quickly while leaving a metal (adhesive or anti-oxidant) layer showing a low etching rate in such a state that it is not completely etched to form burr portions leading to difficulties in subsequent steps. Specifically, short-circuit between the resultant metal electrodes or a lowering in adhesiveness with a resin when the resin for a flattening layer is filled in spacings between the metal electrodes is liable to occur. Further, it also becomes difficult to meet a demand for a thinner electrode width required for a liquid crystal panel of higher resolution in recent years or in the near future.

The etchant for a thin layer containing Cu may generally contain ferric chloride. However, as mentioned above, when a different metal (other than Cu or Cu alloy) is used for constituting the adhesive layer and/or the anti-oxidant layer of the metal electrodes, the layer(s) of such a different metal is not etched completely to be left as burr portions.

Specifically, as shown in FIG. 5, even when a multi-layer metal structure, formed on a (glass) substrate 222, including: a principal conductive layer 220 of Cu or Cu alloy, an adhesive (underlying) layer 223 of Ni-Mo alloy disposed between the substrate 222 and the principal conductive layer 220, and a protective (anti-oxidant) layer 221 of Ni-Mo alloy disposed on the principal conductive layer 220 is etched with a ferric chloride-containing etchant; a part of the protective layer 221 is left as burr portions 224.

This may be attributable to formation of a strong passive film (portion) on the Ni-Mo layer surface, thus requiring a certain time for breaking the passive film.

In the above embodiment, the adhesive and protective layers 223 and 221 are formed of Ni-Mo alloy, not Ni alone. This is because the formation of the layers 223 and 221 requires addition of Mo to the extent that the resultant Ni-Mo alloy layer shows non-magnetic properties when the layers 223 and 221 are formed by magnetron sputtering.

SUMMARY OF THE INVENTION

An object of the present invention is to provide an etching rate capable of suppressing an occurrence of burr portions.

Another object of the present invention is to provide an etching rate capable of providing uniform etching quality in a mass-production process.

According to a first aspect of the present invention, there is provided an etching process, comprising:

preparing an etchant containing ferric chloride and an anticorrosive agent for Cu, and etching with the etchant a multi-layer metal structure including a Cu layer and an Ni layer.

The etchant may preferably further contain ferrous chloride.

According to a second aspect of the present invention, there is provided an etching process, comprising:

preparing an etchant containing ferric chloride and sodium fluoride, and etching with the etchant a multi-layer metal structure including a Cu layer and an Mo layer.

The Mo layer may preferably be an Ni-Mo layer and the etchant may preferably further contain ferrous chloride.

According to a third aspect of the present invention, there is provided an etching process, comprising:

preparing an etchant containing ferric chloride, etching with the etchant a multi-layer metal structure including a Cu layer and an Ni-Mo layer, wherein the Ni-Mo layer contains Mo in an amount of 10–70 at %.

In this etching rate, the etchant may preferably further contain benzotriazole and/or sodium fluoride.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Hereinbelow, the etching processes according to the first to third aspects of the present invention will be specifically described based on preferred (first to third) embodiments, respectively.

(First Embodiment)

According to the first aspect of the present invention, an etchant used in the etching process contains ferric chloride and an anticorrosive agent for Cu. The etchant may preferably further contain ferrous chloride.

In this embodiment, the anticorrosive agent for Cu (which is a substance for forming a corrosion-resistant film on the surface of the Cu layer) may preferably be a nitrogen-containing cyclic (or heterocyclic) compound, such as benzotriazole, thiocyanuric acid or ethylenethiourea.

The multi-layer metal structure to be etched with the etchant includes a Cu layer and an Ni layer and may generally be formed on a glass substrate to constitute metal electrodes as auxiliary electrodes for a liquid crystal panel or device.

Herein, the "Cu layer" represents a layer of Cu or Cu alloy and the "Ni layer" represents a layer of Ni and Ni alloy.

The multi-layer metal structure may be formed on the surface of a substrate (e.g., a glass substrate) by sputtering (e.g., magnetron sputtering), followed by etching through the etching process according to the first aspect of the present invention.

Figure 1:
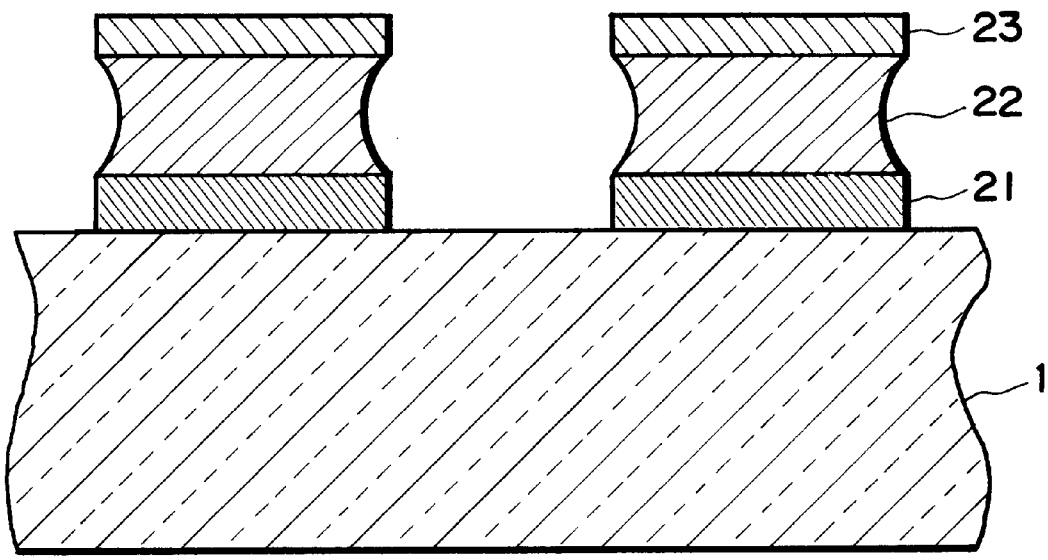
FIGS. 1, 3A, 3B and 5 are respectively a schematic sectional view of a metal electrode (multi-layer metal structure) formed on a glass substrate by a conventional etching process, for illustrating a state of an occurrence of burr portions of the multi-layer metal structure.
Figure 2:
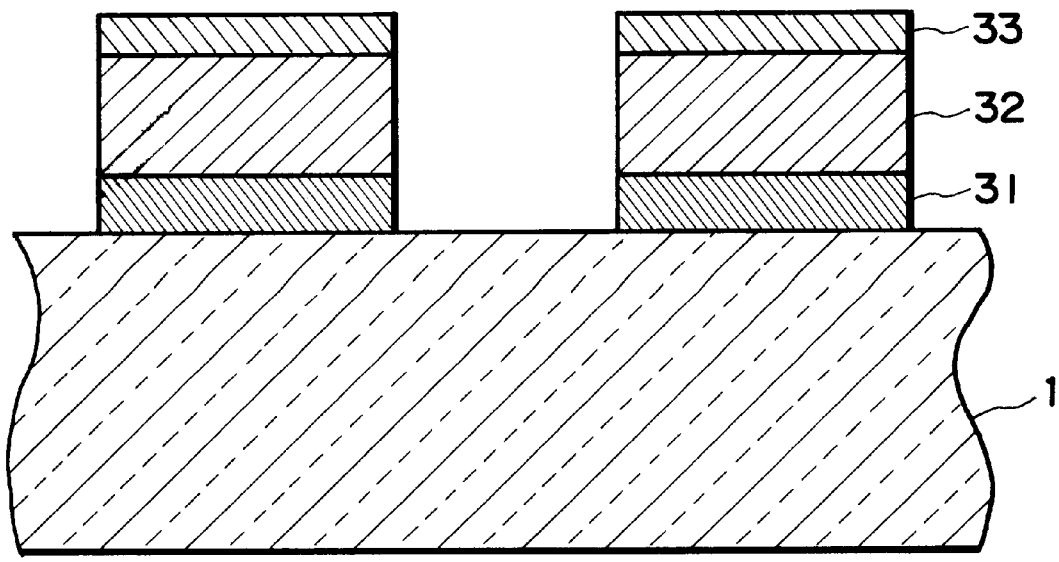
FIGS. 2, 4A, 4B, 7 and 9 are respectively a schematic sectional view of a metal electrode (multi-layer metal structure) formed on a glass substrate by the etching rate according to the present invention.
Figure 3A:
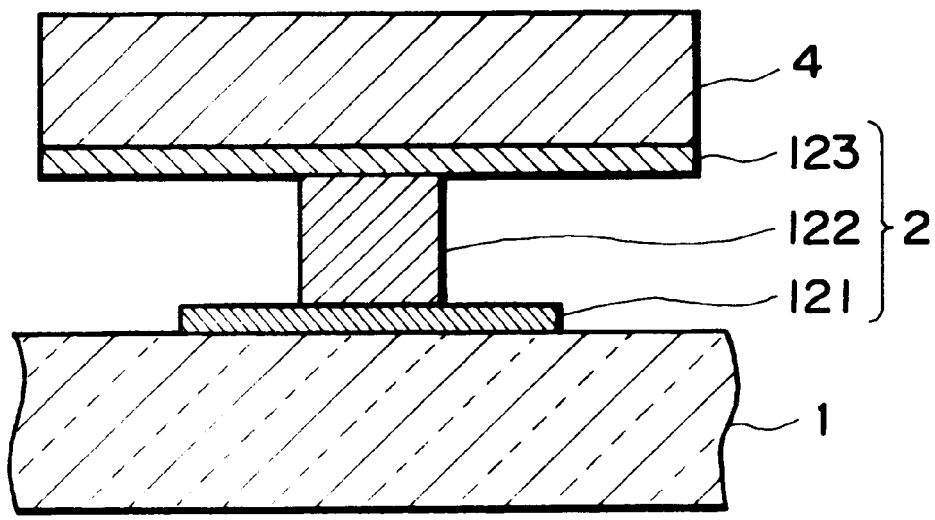
Figure 3B:
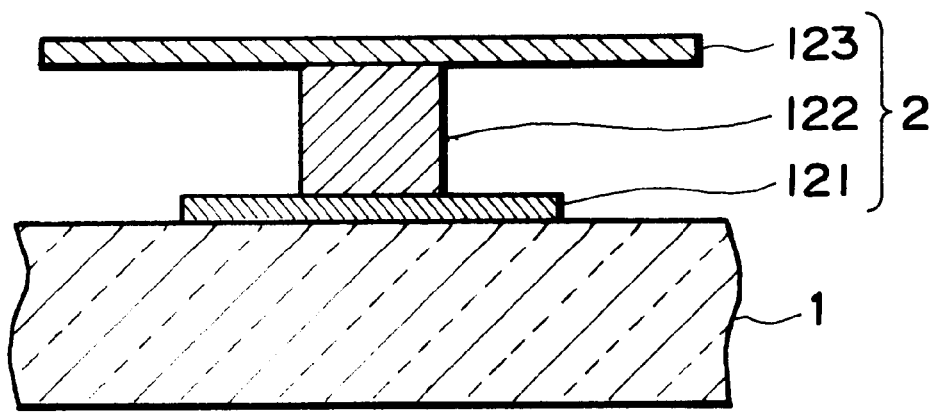

FIG. 2 shows a state of the multi-layer structure after the etching through the etching process.

Referring to FIG. 2, a first layer (Ni layer) 31 is formed on a substrate (glass substrate) 1 and thereon, a second layer (Cu layer) 32 is formed to cover the first layer 31. The first layer 31 functions as an adhesiveness-improving (adhesive) layer allowing quick signal transmission due to its low electrical resistance.

The first layer 31 may be formed in a thickness sufficient to ensure the adhesiveness with the substrate 1, generally of 300–1000 Å, in the case of using, e.g., a 1 $\mu$m-thick second layer 32. The thickness of the second layer 32 may appropriately be determined depending on a desired electrical resistance and other device structures (e.g., panel size, the number of pixels, principal electrode thickness) of a resultant liquid crystal panel. In general, the thickness of the second layer 32 of Cu is ca. 1 $\mu$m or thicker.

On the second layer 32, a third layer (Ni layer) 33 for oxidation prevention may be formed to cover the second layer 32 in a thickness, sufficient to ensure the oxidation-preventing effect, generally of 300–1000 Å, in the case of using, e.g., a 1 $\mu$m-thick second layer 32.

According to this embodiment, by the use of the nitrogen-containing (hetero)cyclic compound, an anticorrosive film is formed on the surface of the Cu layer, thus appropriately suppressing a degree of etching of the Cu layer. Further, the addition of ferrous chloride promotes etching of the Ni layer. As a result, it is possible to realize a substantially equal etching rates with respect to the layers of different metal species (Cu (alloy) and Ni (alloy)), thus effectively preventing an occurrence of burr portions caused by different etching rates. In order to provide a substantially identical etching rate between the Cu layer and the Ni layer(s) in the case of using a thicker Ni layer (e.g., at least 500 Å-thick) disposed on (and under) the Cu layer, the etchant should desirably contain ferrous chloride in view of insufficient etching of the Ni layer(s) by ferric chloride alone.

Further, different from a conventional etchant, the above-mentioned etchant allows an easy temperature control and is not required to addition of peroxide, thus facilitating a control of the etching rate and providing uniform etching qualities particularly in a mass-production process.

In the first to third aspect of the present invention, the etchant used may preferably contain at least ferrous chloride, ferric chloride and water in an appropriate proportion. For example, when (a) a solution of ferrous chloride in hydrochloric acid (30 w/w %) and (b) an aqueous solution of ferric chloride (42° Be', specifically defined hereinafter) are diluted with (c) pure water, the dilution ratio (mixing ratio) in volume of these components ((a):(b):(c)) may preferably be 1:1:8 to 1:1:30, more preferably 1:1:12 to 1:1:24.

(Second Embodiment)

According to the second aspect of the present invention, an etchant used in the etching process contains ferric chloride and sodium fluoride. The etchant may preferably further contain an anti-corrosive agent for Cu. Amounts of respective components of the etchant (e.g., ferric chloride, sodium fluoride, and the anti-corrosive agent for Cu) may appropriately be adjusted so as to provide an identical etching rate for respective layers of the multi-layer metal structure.

In this embodiment, examples of the anticorrosive agent for Cu may include a nitrogen-containing (hetero-)cyclic compound, such as benzotriazole, thiocyanuric acid or ethylenethiourea.

The multi-layer metal structure to be etched with the etchant includes a Cu layer and an Mo layer.

In this embodiment, the Mo layer may preferably contain Ni or Ni alloy and the etchant may preferably contain ferrous chloride.

Herein, the "Mo layer" represents a layer of Mo or Mo alloy.

In this embodiment, the Mo layer may preferably further contain Ni or Ni alloy and the etchant may preferably further contain ferrous chloride.

The multi-layer metal structure may be formed on the surface of a substrate (e.g., a glass substrate) by sputtering (e.g., magnetron sputtering), followed by etching through the etching process according to the second aspect of the present invention.

Figure 4A:
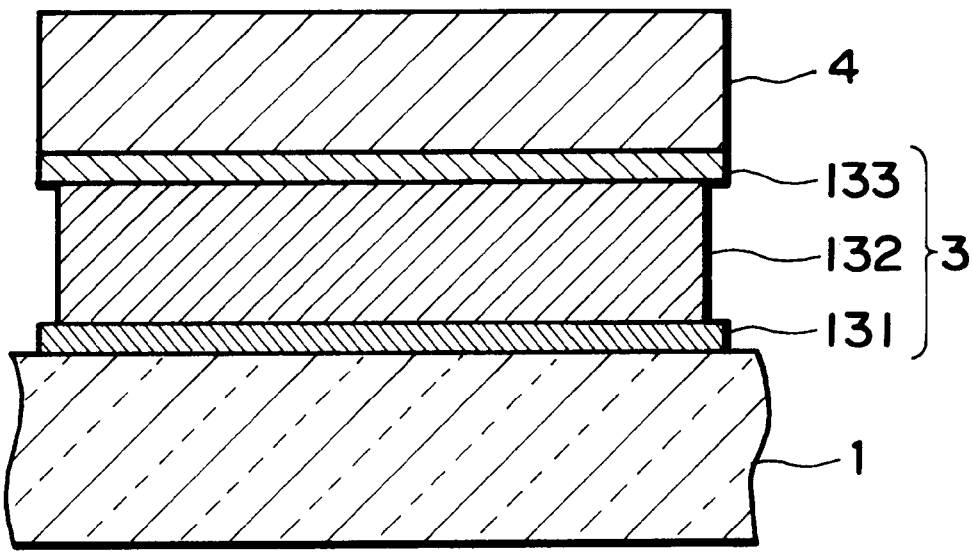
Figure 4B:
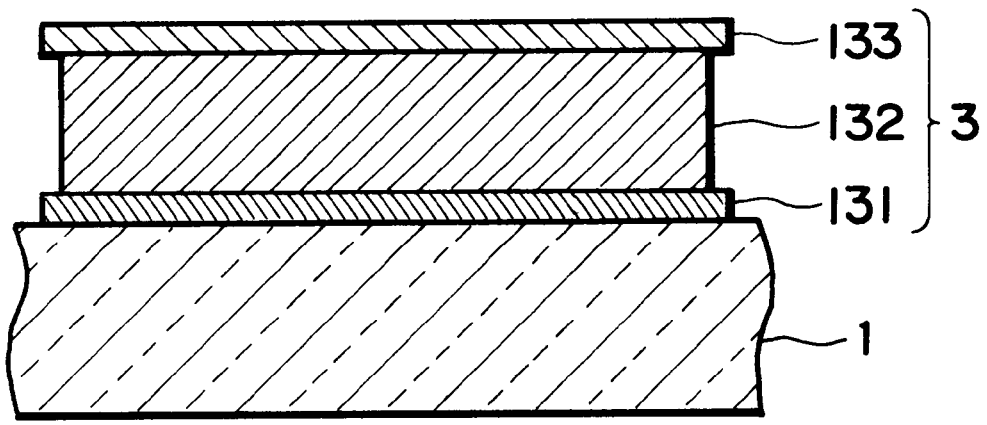
Figure 5:
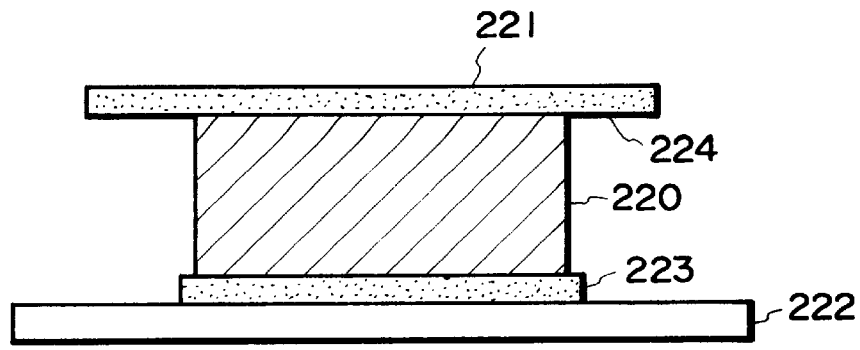

FIGS. 4A and 4B respectively show a state of a multi-layer structure 3 (including three layers 131, 132 and 133) after the etching through the etching process, wherein the multi-layer metal structure 3 in FIG. 4A is covered with an etching resist 4.

Referring to FIGS. 4A and 4B, a first layer (Mo layer) 131 is formed on a substrate (glass substrate) 1 and thereon, a second layer (Cu layer) 132 is formed to cover the first layer 131. The first layer 31 functions as an adhesiveness-improving (adhesive) layer allowing quick signal transmission due to its low electrical resistance.

On the second layer 132, a third layer (Me layer) 133 for oxidation prevention may be formed to cover the second layer 32 in a thickness sufficient to ensure the oxidation-preventing effect.

The first to third layers 131, 132 and 133 preferably have thicknesses similar to those described in the first embodiment, respectively.

In this embodiment, the Mo (first and third) layers 131 and 133 are effectively etched by sodium fluoride when compared with the case of using an etchant containing ferric chloride as a principal component. Further, the Cu layer is etched by ferric chloride while suppressing an etching degree of the Cu layer by the anti-corrosive agent. Etching of an Ni or Ni alloy portion of the Mo layers is promoted.

According to this embodiment, the etching rates of the respective (first to third) layers 131, 132 and 133 constituting the multi-layer metal structure 3 are controlled to provide a substantially identical value by using the above-mentioned etchant, thus effectively suppressing an occurrence of burr portions due to different etching rates and an occurrence of (electrical) short circuit while preventing excessive etching (overetching) of the Cu layer.

(Third Embodiment)

According to the third aspect of the present invention, the multi-layer metal structure including a Cu layer and an Ni-Mo layer containing Mo in an amount of 10–70 at % is etched by an etchant containing ferric chloride to prepare metal electrodes for a liquid crystal device.

Figure 6:
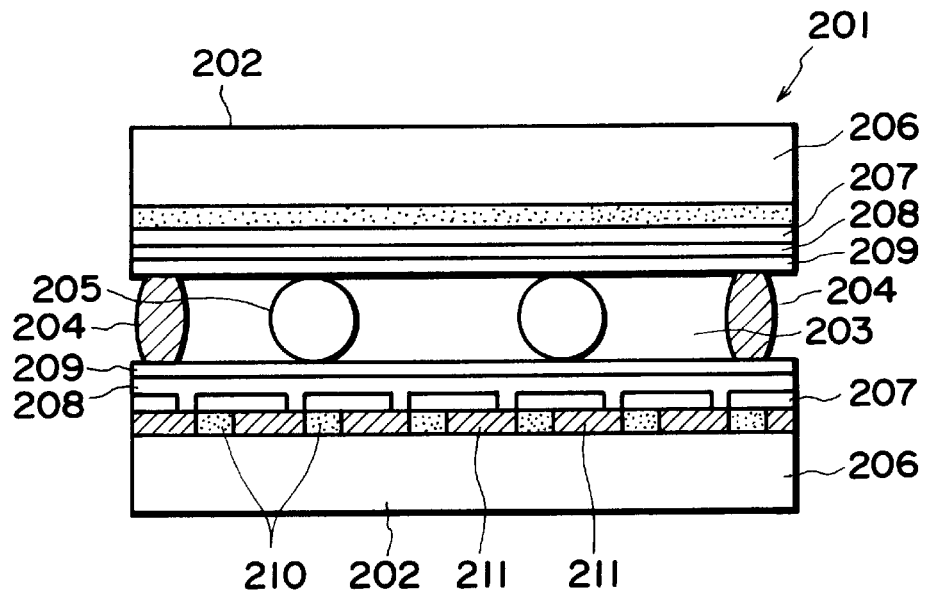
FIG. 6 is a schematic sectional view of a liquid crystal device (panel) employing a metal electrode (multi-layer metal structure) formed through the etching process of the present invention.

FIG. 6 shows a schematic sectional view of an example of a liquid crystal device 201 using metal electrodes 210.

Referring to FIG. 6, the liquid crystal device 201 includes a pair of electrode plates 202 and a liquid crystal 203 disposed between the electrode plates 202 with a prescribed cell gap defined by a sealing agent 204 and a spacer 205 (e.g., silica beads).

Each of the electrode plates 202 includes a glass substrate 206 (light-transmissive support); metal electrodes 210 (auxiliary electrodes) disposed on the glass substrate 206 with spacings; an insulating layer 211 of e.g., ultraviolet (UV)-curable resin disposed in the spacings so as to electrically insulating the respective metal electrodes; transparent electrodes 207 (principal electrodes) disposed on the metal electrodes 210; an insulating film 208 disposed to cover the transparent electrodes 207; and an alignment film 209 disposed on the insulating film 208.

Figure 7:
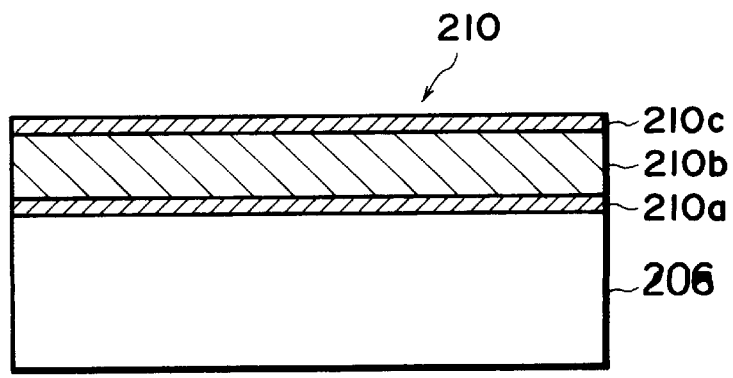

FIG. 7 shows an enlarged view of each metal electrode 210 shown in FIG. 6.

Referring to FIG. 7, the metal electrode (multi-layer metal structure) 210 is formed on the glass substrate 206 and includes an Ni-Mo layer 210a (adhesive layer) disposed on the glass substrate 206, a Cu layer 210b (principal conductive layer) disposed on the Ni-Mo layer 210a, and an Ni-Mo layer 210c (anti-oxidant or protective layer) disposed on the Cu layer 210b.

Specifically, the Ni-Mo layer 210a functions as a layer for improving an adhesive force between the Cu layer 210b and the glass substrate 206, and the Ni-Mo layer 210c is formed on the Cu layer 210b in order to enhance anti-corrosive properties of the Cu layer 210b.

The Ni-Mo layers 210a and 210c each contain Mo in an amount of 10–70 at %.

As mentioned above, the inclusion of Mo (in the Ni-Mo layers) is effective for imparting a property close to non-magnetic properties of the Ni (Ni alloy) layer, thus allowing magnetron discharge. As a result, the Ni-Mo layers 210a and 210c can be formed at a high film-forming speed by a DC magnetron sputtering process (used in Examples appearing hereinafter).

By the use of the etchant according to the third aspect of the present invention, the multi-layer structure including the Ni-Mo layers is appropriately etched without forming burr portions.

In the present invention, the etching process may appropriately be modified with respect to, e.g., components and thicknesses of respective metal layers and a composition (mixing ratios) and species of components of an etchant so long as etching rates of the respective metal layers are controlled to be substantially identical to prevent an occurrence of burr portions. For instance, structural members, etchant components and other factors in the above-mentioned first to third embodiments may appropriately be changed or interchanged.

Hereinbelow, the present invention will be described more specifically based on Examples.

EXAMPLE 1

A multi-layer metal structure including a 300 Å-thick first layer 31 of Ni, a $10^4$ Å-thick second layer 32 of Cu, and a 700 Å-thick third layer 33 of Ni was formed on a glass substrate 1 and etched in the following manner to prepare metal electrodes (patterned multi-layer metal structure) as shown in FIG. 2.

The film formation of the first to third layers 31, 32 and 33 was performed by a magnetron sputtering process using a sputtering apparatus (Model "BSC-700", mfd. by K. K. Synchron) under the following conditions:

| Condition | 1st layer | 2nd layer | 3rd layer |
| --- | --- | --- | --- |
| Pressure (torr) | $3 \times 10^{-3}$ | $3 \times 10^{-3}$ | $3 \times 10^{-3}$ |
| Substrate temp. (° C.) (before sputtering) | 200 | 200 | 200 |
| Ar flow rate (sccm) | 100 | 100 | 100 |
| Target power (W/cm$^2$) | 13 | 28 | 13 |
| Film-forming time (sec) | 60 | 750 | 120 |

An (aqueous) etchant was prepared by diluting with pure water a mixture solution of a hydrochloric acid solution of ferrous chloride (30 w/w %) and a ferric chloride aqueous solution (42° Be' (Baume' degree)) (1:1 by volume) at a dilution ratio (mixture:water=1:16 by volume) and by adding 1,2,3-benzotriazole in the diluted mixture solution at a concentration of 1 g/l, followed by sufficient dissolution of the resultant mixture with ultrasonic wave.

Herein, the "Baume' degree (° Be')" represents a unit of a specific gravity and holds the following relationship with a density (d):

$$d=144.3/(144.3-Be')$$

on the basis of that (0° Be') of pure water and that (66° Be') of conc. sulfuric acid ($d^{15}$=1.8249) at 15° C.

This relationship between the density (d) and the Baume' degree (Be') is held in Japan but can be different in another country.

The Baume' degree for liquids heavier than water is measured by the Baume' hydrometer in a range of 0–72° Be' (e.g., as described in "Rikagaku Ziten" (in Japanese), the 4th edition, page 1230, K.K. Iwanami Shoten).

In this example, the ferric chloride aqueous solution having 42° Be' has a concentration of about 38 wt. %.

By using the etchant, the multi-layer metal structure consisting of the three layers 31, 32 and 33 was etched for 65 sec at 25° C. while masking a prescribed surface of the multi-layer metal structure with an etching resist ("OFPR-800", mfd. by Tokyo Ohka Kogyo K.K.).

More specifically, the etching was performed by spin etching using an etching apparatus. The etching apparatus included a rotatable substrate holder designed to hold the glass substrate 1 (having thereon the first to third layers 31, 32 and 33). The substrate holder was arranged so as to be rotated by a motor and above the substrate holder, a nozzle was disposed opposite to the glass substrate 1 held by the substrate holder and was connected with two pressure vessels through hosepipes and a three-way (cross) valve. One of the pressure vessels contained the etchant and the other pressure vessel contained a rinse liquid. These pressure vessels were supplied with nitrogen gas pressure-controlled by a pressure-regulating valve.

For etching operation, when the motor was driven in a state that the glass substrate 1 was held in the substrate holder, the glass substrate 1 was rotated together with the substrate holder at a prescribed rotation rate (e.g., 400 rpm). In this state, when pressure-controlled nitrogen gas by the pressure-regulating valve was charged in the etchant-containing pressure vessel, the etchant was jetted to the glass substrate 1 through the nozzle. At that time, the etchant-containing pressure vessel was controlled by the three-way valve so as to communicate with the nozzle.

After a prescribed time passed, the three-way valve was changed to jet the rinse liquid for a prescribed time (e.g., 20–30 sec), whereby the etchant remaining on the surface of the glass substrate 1 was removed to complete the etching operation.

Thereafter, the rotation rate of the glass substrate 1 was increased (e.g., 1500 rpm) to spin off or remove the rinse liquid, followed by stop of the drive of the motor.

According to this example, it was possible to achieve effects similar to those described in First Embodiment. Specifically, although the etching time was fluctuated within ±2 sec and the etching temperature was fluctuated between 20° C. and 30° C., no burr portions occurred due to a uniformity of etching rates between the first to third (Ni/Cu/Ni) layers 31, 32 and 33.

EXAMPLE 2

A multi-layer metal structure including a 400 Å-thick first layer 31 of Ni-Mo alloy (Mo=10 at %), a $10^4$ Å-thick second layer 32 of Cu, and a 400 Å-thick third layer 33 of Ni-Mo alloy (Mo=10 at %) was formed on a glass substrate 1 by a magnetron sputtering process in the same manner and conditions as in Example 1 except that the film-forming times of the first layer 31 (60 sec) and the third layer 33 (120 sec) were changed to 70 sec.

THe thus formed multi-layer metal structure was etched in the same manner as in Example 1 except that the etchant was changed to an etchant and the spin etching was changed to line etching described below, respectively.

The etchant used in this example was prepared by diluting with pure water a ferric chloride aqueous solution (42° Be') at a dilution ratio (aqueous solution:water=1:24 by volume) and by adding 1,2,3-benzotriazole in the diluted aqueous solution at a concentration of 1 g/l, followed by sufficient dissolution thereof with ultrasonic wave.

The line etching was performed by using a line etching apparatus including a means for conveying the glass substrate 1 on which the multi-layer metal structure was formed and a plurality of nozzles disposed opposite to the glass substrate 1.

For etching, the etchant and a rinse liquid were jetted to the glass substrate 1 being conveyed under etching conditions (e.g., time and temperature) similarly as in Example 1.

According to this example, the etchant penetrated into the third layer (Ni-Mo layer) 33 to reach the second layer (Cu layer) 32 at which the etchant reacted with (dissolve) the second layer (Cu layer) 32 to form ferrous chloride, whereby the third layer (Ni-Mo layer) 33 and the first layer (Ni-Mo layer) 31 were etched, thus uniformize etching rates of the first to third layers 31, 32 and 33.

As a result, similar effects as in Example 1 were also achieved in this example.

EXAMPLE 3

A multi-layer metal structure including first to third layers 31, 32 and 33 was formed on a glass substrate 1 in the same manner as in Example 2.

The thus formed multi-layer metal structure was etched in the same manner as in Example 2 except for using an etchant prepared in the following manner.

The etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water= 1:24 by volume) and by adding thiocyanuric acid (1,3,5s-triazine-2,4,6-trithiol) in the diluted mixture solution at a concentration of 1 g/l, followed by sufficient dissolution with ultrasonic wave.

According to this example, similar effects as in Example 1 were achieved.

EXAMPLE 4

A multi-layer metal structure including first to third layers 31, 32 and 33 was formed on a glass substrate 1 in the same manner as in Example 2.

The thus formed multi-layer metal structure was etched in the same manner as in Example 2 except for using an etchant prepared in the following manner.

The etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water= 1:16 by volume) and by adding ethylenethiourea in the diluted mixture solution at a concentration of 5 g/l, followed by sufficient dissolution with ultrasonic wave.

According to this example, it was also possible to obtain similar effects as in Example 1.

EXAMPLE 5

A multi-layer metal structure including a 500 Å-thick first layer 131 of Cu-Mo alloy (Mo=20 at %), a $10^4$ Å-thick second layer 132 of Cu, and a 500 Å-thick third layer 133 of Cu-Mo alloy (Mo=20 at %) was formed on a glass substrate 1 and etched in the following manner to prepare metal electrodes (patterned multi-layer metal structure) as shown in FIGS. 4A and 4B.

The film formation of the first to third layers 131, 132 and 133 was performed by a magnetron sputtering process using a sputtering apparatus (Model "BSC-700", mfd. by K. K. Synchron) under the following conditions:

| Condition | 1st layer | 2nd layer | 3rd layer |
| --- | --- | --- | --- |
| Pressure (torr) | $3 \times 10^{-3}$ | $3 \times 10^{-3}$ | $3 \times 10^{-3}$ |
| Substrate temp. (° C.) (before sputtering) | 200 | 200 | 200 |
| Ar flow rate (sccm) | 100 | 100 | 100 |

-continued

| Condition | 1st layer | 2nd layer | 3rd layer |
|---|---|---|---|
| Target power (W/cm$^2$) | 13 | 28 | 13 |
| Film-forming time (sec) | 90 | 750 | 90 |

An (aqueous) etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water=1:16 by volume) and by adding sodium fluoride in the diluted mixture solution at a concentration of 2 g/l, followed by sufficient dissolution of the resultant mixture with ultrasonic wave.

By using the etchant, the multi-layer metal structure consisting of the three layers 131, 132 and 133 was etched for 80 sec at 25° C. while masking a prescribed surface of the multi-layer metal structure with an etching resist 4 ("OFPR-800", mfd. by Tokyo Ohka Kogyo K.K.) (FIG. 4A).

More specifically, the etching was performed by spin etching using an etching apparatus. The etching apparatus included a rotatable substrate holder designed to hold the glass substrate 1 (having thereon the first to third layers 131, 132 and 133). The substrate holder was arranged so as to be rotated by a motor and above the substrate holder, a nozzle was disposed opposite to the glass substrate 1 held by the substrate holder and was connected with two pressure vessels through hosepipes and a three-way (cross) valve. One of the pressure vessels contained the etchant and the other pressure vessel contained a rinse liquid. These pressure vessels were supplied with nitrogen gas pressure-controlled by a pressure-regulating valve.

For etching operation, when the motor was driven in a state that the glass substrate 1 was held in the substrate holder, the glass substrate 1 was rotated together with the substrate holder at a prescribed rotation rate. In this state, when pressure-controlled nitrogen gas by the pressure-regulating valve was charged in the etchant-containing pressure vessel, the etchant was jetted to the glass substrate 1 through the nozzle. At that time, the etchant-containing pressure vessel was controlled by the three-way valve so as to communicate with the nozzle.

After a prescribed time passed, the three-way valve was changed to jet the rinse liquid for a prescribed time, whereby the etchant remaining on the surface of the glass substrate 1 was removed to complete the etching operation.

Thereafter, the rotation of the glass substrate 1 was maintained to spin off or remove the rinse liquid, followed by stop of the drive of the motor.

According to this example, it was possible to achieve effects similar to those described in Second Embodiment. Specifically, e.g., no burr portions occurred due to a uniformity of etching rates between the first to third (Cu-Mo/Cu/Cu-Mo) layers 131, 132 and 133.

EXAMPLE 6

A multi-layer metal structure including a 350 Å-thick first layer 131 of Ni-Mo alloy (Mo=10 at %), a 10$^4$ Å-thick second layer 132 of Cu, and a 350 Å-thick third layer 133 of Ni-Mo alloy (Mo=10 at %) was formed on a glass substrate 1 by a magnetron sputtering process in the same manner and conditions as in Example 5 except that the film-forming time (90 sec) of the first layer 31 and the third layer 33 was changed to 60 sec.

THe thus formed multi-layer metal structure was etched in the same manner as in Example 5 except that the etchant was changed to an etchant prepared in the following manner and the etching time (80 sec) was changed to 130 sec.

The etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water=1:16 by volume) and by adding 1,2,3-benzotriazole and sodium fluoride each in the diluted mixture solution at a concentration of 2 g/l, followed by sufficient dissolution of the resultant mixture with ultrasonic wave.

According to this example, it was possible to achieve effects similar to those in Example 5.

EXAMPLE 7

A multi-layer metal structure including a 200 Å-thick first layer 131 of Mo, a 10$^4$ Å-thick second layer 132 of Cu, and a 200 Å-thick third layer 133 of Mo was formed on a glass substrate 1 by a magnetron sputtering process in the same manner and conditions as in Example 5 except that the target power (13 W/cm$^2$) and the film-forming time (90 sec) of the first layer 31 and the third layer 33 were changed to 18 W/cm$^2$ and 60 sec, respectively.

The thus formed multi-layer metal structure was etched in the same manner as in Example 5 except that the etchant was changed to an etchant prepared in the following manner and the etching time (80 sec) was changed to 210 sec.

The etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water=1:8 by volume) and by adding 1,2,3-benzotriazole and sodium fluoride in the diluted mixture solution at a concentration of 2 g/l and 5 g/l, respectively, followed by sufficient dissolution of the resultant mixture with ultrasonic wave.

According to this example, it was possible to achieve effects similar to those in Example 5.

EXAMPLE 8

Seven multi-layer metal structures each including an Ni-Mo layer, a Cu layer and an Ni-Mo layer wherein each Ni-Mo layer contained a prescribed amount of Mo (8 at %, 10 at %, 30 at %, 50 at %, 70 at %, 75 at %, or 80 at %) were prepared and evaluated in the following manner, respectively.

Figure 8A:
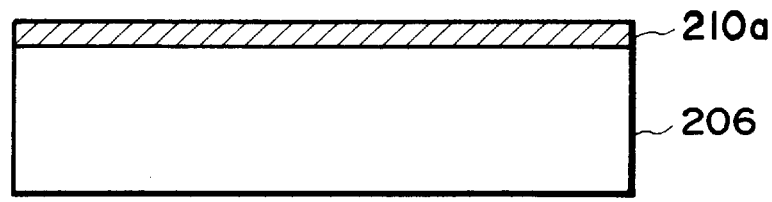
FIGS. 8A and 8B are schematic sectional views for illustrating a process for producing a metal electrode on a glass substrate.

A glass substrate 206 (as shown in FIG. 8A) was prepared by polishing a blue plate glass and was coated with a polymer (resin) film, followed by baking for 2 hours at 120° C.

On the polymer film (formed on the glass substrate 206), a first layer (adhesive layer) 210a of Ni-Mo alloy was formed by a DC sputtering process in a thickness of 350 Å sufficient to ensure an adhesiveness.

Figure 8B:
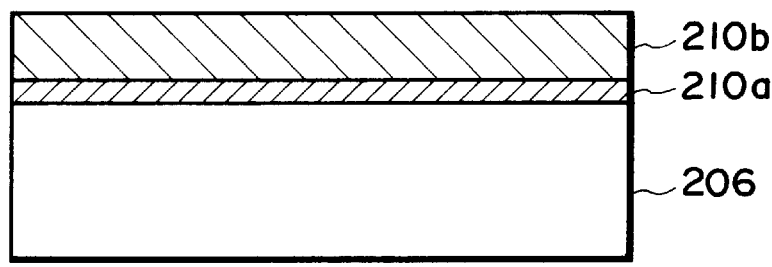

Then, on the first layer 210a, a 1 μm-thick second layer (principal conductive layer) 210b of Cu was formed in a similar manner (FIG. 8B).

Similarly, on the second layer 210b, a third layer (protective layer) 210c of Ni-Mo alloy was formed in a thickness of 350 Å sufficient to prevent oxidation of Cu to obtain a multi-layer metal structure 210 (FIG. 7).

The DC sputtering process was performed by using a sputtering apparatus ("Model BSC-700, mfd. by K. K. Synchron) under the following conditions:

| Condition | 1st layer | 2nd layer | 3rd layer |
|---|---|---|---|
| Pressure (torr) | $3 \times 10^{-3}$ | $3 \times 10^{-3}$ | $3 \times 10^{-3}$ |
| Substrate temp. (° C.) (before sputtering) | 200 | 200 | 200 |
| Ar flow rate (sccm) | 100 | 100 | 100 |
| Target power (W/cm²) | 13 | 28 | 13 |
| Film-forming time (sec) | 60 | 750 | 60 |

The multi-layer metal structure 210 was masked with an etching resist ("OFPR-800", mfd. by Tokyo Ohka Kogyo K.K.) so as to provide a prescribed etching pattern.

Thereafter, the multi-layer metal structure 210 was etched with an etchant prepared in the following manner by spin etching.

The etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water= 1:16 by volume) and by adding 1,2,3-benzotriazole in the diluted mixture solution at a concentration of 2 g/l, followed by sufficient dissolution at the resultant mixture with ultrasonic wave.

Figure 9:
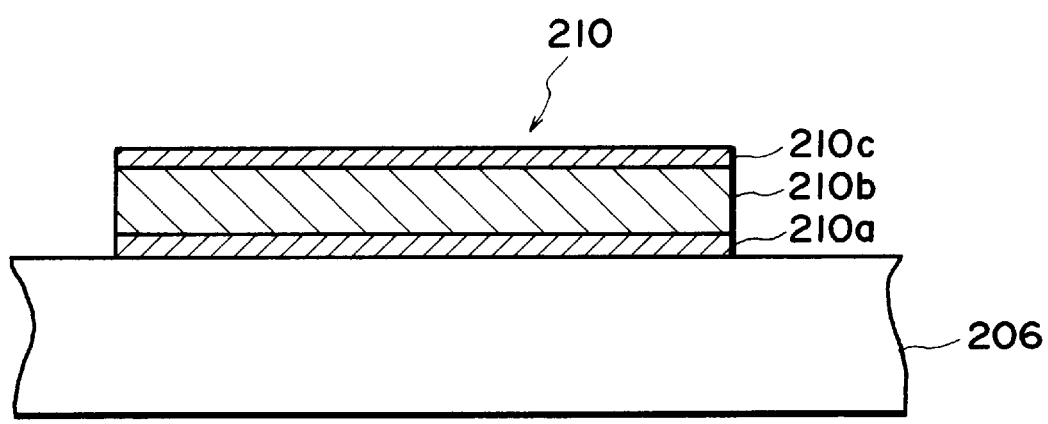

The spin etching was performed by spraying the etchant on the multi-layer metal structure 210 for 130 sec at 25° C. while rotating the glass substrate 206 at 400 rpm, thus forming a metal electrode 210 on the glass substrate 206 (FIG. 9).

In this example, the seven multi-layer metal structure 210 were formed and etched, respectively, in order to examine a correlation between the Mo content and a degree of an occurrence of burr portions. For the formation of the Ni-Mo layers, the sputtering rates for the respective Ni-Mo layers (different in Mo content) were substantially not changed.

After the etching, the respective multi-layer structures were subjected to observation through a scanning electron microscope (SEM; magnification=10000).

The results are shown in Table 1.

TABLE 1

| Mo (at %) | 8 | 10 | 30 | 50 | 70 | 75 | 80 |
|---|---|---|---|---|---|---|---|
| Burr* | B | A | A | A | A | B | B |

*)A: No or slight burr portions (at most 0.1 μm in width) were observed.
B: Large burr portions (at least 1 μm in width) were observed over the entire multi-layer structure or etching of the multi-layer structure did not proceed.

As apparent from the above results (Table 1), it was found that the multi-layer metal structures including the Ni-Mo layer (protective layer) 210c containing Mo in an amount of 10–70 at % did not cause burr portions for the Ni-Mo layer (protective layer) 210c, thus providing a prescribed metal electrode 210 well patterned on the glass substrate 206 as shown in FIG. 9.

In the case of the Mo content of 75 at % and 80 at %, etching of the multi-layer metal structures did not proceed but when the etching was further continued for a long time (e.g., at least 300 sec), the Cu (second) layer 210b was completely etched (removed) during etching of the Ni-Mo (third) layer 210c, thus failing to provide a practical metal electrode.

This is presumably because the Cu layer 210b has been etched (completely) due to the etchant penetrated through the Ni-Mo layer 210b at an insufficiently film-formed Ni-Mo portion thereof or at an Ni-lacking portion thereof since an Mo portion of the Ni-Mo layer 210c is little etched with ferric chloride and ferrous chloride contained in the etchant.

Separately, a passive film-breaking time ($T_{break}$) (sec) of Ni-Mo single layer different in Mo content (at %) was examined in the following manner.

Each of sample films (Ni-Mo single layers) was formed in a thickness of 5000 Å on a glass substrate in the same manner ass above except for film-forming times, and was left standing for 24 hours to form a passive film on the Ni-Mo layer surface.

Each of the thus prepared sample films was etched (dissolved) with the above-mentioned etchant (prepared in this example) to measure the passive film-breaking time while monitoring a spontaneous potential.

Herein, the "passive film-breaking time ($T_{break}$)" is determined as a time (sec) required for decreasing an initial (spontaneous) potential of ca. 500 mV (immediately after the contact of the sample film with the etchant) to a (spontaneous) potential of 100–300 mV since the passive film shows a spontaneous potential of ca. 500 mV and an active Ni-Mo layer shows a spontaneous potential of 100–300 mV.

The results are shown in Table 2.

TABLE 2

| Mo (at %) | 8 | 10 | 30 | 50 | 70 | 75 | 80 |
|---|---|---|---|---|---|---|---|
| $T_{break}$ (sec) | 68 | 5 | 1 | 1 | 1 | —** | —** |

**)Not measure (a marked decrease in spontaneous potential was not confirmed).

From the above results (Table 2), when the Mo content was at least 10 at %, it was found that the passive film-breaking time ($T_{break}$) was shortened to allow etching without causing an occurrence of burr portions.

In the case of the Mo content of 8 at %, it may be considered that the etching of Cu proceeds during the breaking of the passive film, thus resulting in burr portions of the Ni-Mo layer including the passive film formed thereon.

According to this example; it was found that the Mo content allowing etching free from an occurrence of burr portions was in the range of 10–70 at %. In other words, when the Mo content of the Ni-Mo layer used is set to 10–70 at %, it is possible to effectively suppress the occurrence of burr portions.

EXAMPLE 9

In this example, multi-layer metal structures not including an adhesive layer (first layer) were prepared and evaluated.

Each of the multi-layer metal structures was prepared, etched and evaluated in the same manner as in Example 8 except that the layer structure and film-forming time were changed as follows.

|  | Example 8 | Example 9 |
|---|---|---|
| 1st layer (Å) | Ni-Mo (350) | — |
| 2nd layer (μm) | Cu (1) | Cu-N*1 (2) |
| 3rd layer (Å) | Ni-Mo (350) | Ni-Mo*2 (700) |
| Film-forming time (2nd layer)(sec) | 750 | 1500 |

-continued

| | Example 8 | Example 9 |
|---|---|---|
| Film-forming time (3rd layer)(sec) | 60 | 120 |

*1)Cu doped with nitrogen in an amount of 1 at %.
*2)Mo content: 8, 10, 30, 50, 70, 75 and 80 at %.

The evaluation results are shown in Tables 3 and 4 below.

TABLE 3

| Mo (at %) | 8 | 10 | 30 | 50 | 70 | 75 | 80 |
|---|---|---|---|---|---|---|---|
| Burr* | B | A | A | A | A | B | B |

*)The same as in Table 1.

As apparent from Table 3, similarly as in Example 8, the Mo contents of 10–70 at % were found to allow uniform etching free from burr portions. In the case of the Mo contents of 75 at % and 80 at %, a prescribed etching pattern was not formed since the etching of the Ni-Mo layer little proceeded and that of the Cu layer proceeded excessively.

TABLE 4

| Mo (at %) | 8 | 10 | 30 | 50 | 70 | 75 | 80 |
|---|---|---|---|---|---|---|---|
| $T_{break}$ (sec) | 55 | 4 | 1 | 1 | 1 | —** | —** |

**)Not measurable.

From the above results (Table 2), when the Mo content was at least 10 at %, it was found that the passive film-breaking time ($T_{break}$) was shortened to allow etching without causing an occurrence of burr portions.

In the case of the Mo content of 8 at %, it may be considered that the etching of Cu proceeds during the breaking of the passive film, thus resulting in burr portions of the Ni-Mo layer including the passive film formed thereon.

According to this example; it was found that the Mo content allowing etching free from an occurrence of burr portions was in the range of 10–70 at % even when the multi-layer metal structure (metal electrode) was not provided with the adhesive layer. In other words, when the Mo content of the Ni-Mo layer used is set to 10–70 at %, it is possible to effectively suppress the occurrence of burr portions.

EXAMPLE 10

Seven multi-layer metal structures (as shown in FIG. 7) each including an Ni-Mo layer, a Cu layer and an Ni-Mo layer wherein each Ni-Mo layer contained a prescribed amount of Mo (8 at %, 10 at %, 30 at %, 50 at %, 70 at %, 75 at %, or 80 at %) were prepared and evaluated in the following manner, respectively.

On a glass substrate 206, a 400 Å-thick first layer (adhesive layer) 210a of Ni-Mo alloy was formed by a magnetron sputtering process.

Then, on the first layer 210a, a 1 µm-thick second layer (principal conductive layer) 210b of Cu was formed in a similar manner.

Similarly, on the second layer 210b, a 400 Å-thick third layer (protective or anti-oxidant layer) 210c of Ni-Mo alloy was formed to obtain a multi-layer metal structure 210 (FIG. 7).

The DC sputtering process was performed by using a sputtering apparatus ("Model BSC-700, mfd. by K. K. Synchron) under the following conditions:

| Condition | 1st layer | 2nd layer | 3rd layer |
|---|---|---|---|
| Pressure (torr) | $3 \times 10^{-3}$ | $3 \times 10^{-3}$ | $3 \times 10^{-3}$ |
| Substrate temp. (° C.) (before sputtering) | 200 | 200 | 200 |
| Ar flow rate (sccm) | 100 | 100 | 100 |
| Target power (W/cm$^2$) | 13 | 28 | 13 |
| Film-forming time (sec) | 70 | 750 | 70 |

The multi-layer metal structure 210 was masked with an etching resist ("OFPR-800", mfd. by Tokyo Ohka Kogyo K.K.) so as to provide a prescribed etching pattern.

Thereafter, the thus prepared multi-layer metal structure 210 was etched and evaluated in the same manner as in Example 8 except for using an etchant prepared in the following manner.

The etchant was prepared by diluting with pure water a mixture solution of a hydrochloric acid solution of ferrous chloride (30 w/w %) and a ferric chloride aqueous solution (42° Be') (1:1 by volume) at a dilution ratio (mixture:water= 1:16 by volume) and by adding 1,2,3-benzotriazole and sodium fluoride in the diluted mixture solution each at a concentration of 2 g/l, followed by sufficient dissolution at the resultant mixture with ultrasonic wave.

The evaluation results are shown in Tables 5 and 6 below.

Table 5

| Mo (at %) | 8 | 10 | 30 | 50 | 70 | 75 | 80 |
|---|---|---|---|---|---|---|---|
| Burr* | B | A | A | A | A | B | B |

*)The same as in Table 1.

As apparent from Table 5, similarly as in Example 8, the Mo contents of 10–70 at % in the Ni-Mo layers (as the adhesive and protective layers) were found to allow uniform etching free from burr portions.

In the case of the Mo content of 75 at % and 80 at %, etching of the multi-layer metal structures did not proceed but when the etching was further continued for a long time, the Cu (principal conductive) layer 210b was etched (removed) due to penetration of the etchant into the Cu layer from a thin protective layer (Ni-Mo layer) portion although etching of the Ni-Mo (protective) layer 210c little proceeded, thus failing to provide a practical metal electrode.

TABLE 6

| Mo (at %) | 8 | 10 | 30 | 50 | 70 | 75 | 80 |
|---|---|---|---|---|---|---|---|
| $T_{break}$ (sec) | 68 | 5 | 1 | 1 | 1 | —** | —** |

**)Not measurable.

From the above results (Table 6), when the Mo content was at least 10 at %, it was found that the passive film-breaking time ($T_{break}$) was shortened to allow etching without causing an occurrence of burr portions.

In the case of the Mo content of 8 at % ($T_{break}$), it may be considered that the etching of Cu preferentially proceeds during the breaking of the passive film due to the etchant penetrating into the Cu layer through a thin or insufficiently film-formed portion of the Ni-Mo layer, thus resulting in overetching of the Cu layer.

According to this example; it was found that the Mo content allowing etching free from an occurrence of burr portions was in the range of 10–70 at %.

As described hereinabove, according to the etching rate of the first aspect of the present invention, the surface of the Cu layer is coated with the anti-corrosive agent for Cu to suppress excessive etching of the Cu layer while promoting etching of the Ni layer by ferrous chloride, thus rendering the etching rates of the different metal layers substantially equal to suppress an occurrence of burr portions due to different etching rates for the metal layers. Further, a temperature control of the etchant (aqueous etching liquid) can readily be effected and there is unnecessary to add peroxide, thus facilitating an etching rate control to provide uniform etching qualities in a mass-production process.

In the etching process according to the second aspect of the present invention, the Mo layer can be effectively etched by sodium fluoride to prevent the formation of burr portions resulting from an insoluble portion of the Mo layer.

Further, by a combination of a multi-layer metal structure including a Cu layer and Mo layer(s) an an etchant containing ferric chloride and an anti-corrosive agent for Cu, it is possible to provide a uniform etching rate among these layers, thus effectively preventing an occurrence of burr portions.

In the etching process according to the third aspect of the present invention, by setting an Mo content of an anti-oxidant Ni-Mo layer (and an adhesive Ni-Mo layer) to 10–70 at %, it is possible to provide a metal electrode free from burr defects of the Ni-Mo layer(s).

What is claimed is:

1. An etching process, comprising:
   preparing an etchant containing ferric chloride and an anticorrosive agent for Cu, and
   etching with said etchant a multi-layer metal structure including a Cu layer and an Ni layer.

2. A process according to claim 1, wherein said etchant further contains ferrous chloride.

3. A process according to claim 2, wherein the anticorrosive agent for Cu comprises a nitrogen-containing cyclic compound.

4. A process according to claim 3, wherein the nitrogen-containing cyclic compound comprises benzotriazole.

5. A process according to claim 3, wherein the nitrogen-containing cyclic compound comprises thiocyanuric acid.

6. A process according to claim 3, wherein the nitrogen-containing cyclic compound comprises ethylenethiourea.

7. A process according to any one of claims 2–6, wherein the Cu layer comprises a layer of Cu or Cu alloy.

8. A process according to any one of claims 2–7, wherein the Ni layer comprises a layer of Ni or Ni alloy.

9. An etching process, comprising:
   preparing an etchant containing ferric chloride and sodium fluoride, and
   etching with said etchant a multi-layer metal structure including a Cu layer and an Mo layer.

10. A process according to claim 9, wherein said etchant further contains an anticorrosive agent for Cu comprising benzotriazole.

11. A process according to claim 9 or 10, wherein the Cu layer comprises a layer of Cu or Cu alloy.

12. A process according to claim 9 or 10, wherein the Mo layer comprises a layer of Mo or Mo alloy.

13. A process according to claim 9 or 10, wherein the Mo layer comprises a layer of Ni-Mo alloy and said etchant further contains ferrous chloride.

14. An etching process, comprising:
   preparing an etchant containing ferric chloride and sodium fluoride,
   etching with said etchant a multi-layer metal structure including a Cu layer and an Ni-Mo layer,
   wherein the Ni-Mo layer contains Mo in an amount of 10–70 at %.

15. A process according to claim 14, wherein said etchant further contains benzotriazole.

* * * * *